United States Patent
Rowell et al.

(10) Patent No.: US 10,725,168 B2
(45) Date of Patent: Jul. 28, 2020

(54) NEAR-FIELD MEASUREMENT SYSTEM AND METHOD FOR OBTAINING FAR-FIELD CHARACTERISTICS

(71) Applicant: Rohde & Schwarz GmbH & Co. KG, Munich (DE)

(72) Inventors: Corbett Rowell, Munich (DE); Benoit Derat, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 354 days.

(21) Appl. No.: 15/836,438

(22) Filed: Dec. 8, 2017

(65) Prior Publication Data

US 2019/0179005 A1     Jun. 13, 2019

(51) Int. Cl.
| | |
|---|---|
| *G01S 13/82* | (2006.01) |
| *G01R 29/26* | (2006.01) |
| *G01R 29/08* | (2006.01) |
| *G01S 13/87* | (2006.01) |
| *G01S 13/66* | (2006.01) |

(52) U.S. Cl.
CPC ........ *G01S 13/825* (2013.01); *G01R 29/0864* (2013.01); *G01R 29/26* (2013.01); *G01S 13/878* (2013.01); *G01S 13/66* (2013.01)

(58) Field of Classification Search
CPC ...... G01S 13/825; G01S 13/878; G01S 13/66; G01R 29/0864; G01R 29/26
USPC ....................................................... 324/613
See application file for complete search history.

(56) References Cited

U.S. PATENT DOCUMENTS

| | | | |
|---|---|---|---|
| 6,339,393 B1 | 1/2002 | Burnside et al. | |
| 8,093,909 B2 | 1/2012 | Wendler et al. | |
| 8,330,640 B2 | 12/2012 | Liu | |
| 9,100,115 B1 * | 8/2015 | Stanciu | H04B 17/309 |
| 2008/0018450 A1 | 1/2008 | Volpi et al. | |
| 2018/0006745 A1 * | 1/2018 | Vanwiggeren | H04B 17/3912 |

OTHER PUBLICATIONS

Hohne et al.; "Phase Noise in Beamforming"; Pub. Date Dec. 2010; IEEE Transactions on Wireless Communications; vol. 9, No. 12 (Year: 2010).*
Lorenz et al.; "The Influence of Hardware Imperfections onto Wave-Field Synthesis Accuracy"; Pub. Date Mar. 2015; WSA 2015 (Year: 2015).*

* cited by examiner

*Primary Examiner* — Melissa J Koval
*Assistant Examiner* — Rahul Maini
(74) *Attorney, Agent, or Firm* — Ditthavong & Steiner P.C.

(57) ABSTRACT

A measurement system is provided. The measurement system comprises a device under test comprising at least two signal paths, at least two measurement antennas being spatially separated in the near-field of the device under test, and a signal analysis unit. Whereas each of the at least two signal paths of the device under test comprises an antenna and a power amplifier, noise of the power amplifiers of the at least two signal paths of the device under test is not phase-coherent. In this context, the signal analysis unit is configured to perform at least two time-coherent measurements with the aid of the at least two measurement antennas with respect to the device under test in near-field. In addition to this, the signal analysis unit is further configured to calculate at least one signal characteristic, especially error vector magnitude and/or signal-to-noise ratio, in far-field on the basis of the at least two time-coherent measurements in the near-field.

16 Claims, 3 Drawing Sheets

NEAR-FIELD MEASUREMENT SYSTEM AND METHOD FOR OBTAINING FAR-FIELD CHARACTERISTICS

TECHNICAL FIELD

The invention relates to a measurement system and a measurement method for investigating a device under test with respect to its far-field characteristics, especially error vector magnitude and signal-to-noise ratio, on the basis of near-field measurements.

BACKGROUND ART

Generally, in times of an increasing number of wireless communication applications such as MIMO (Multiple Input Multiple Output) systems, there is a growing need of a measurement system and a measurement method for investigating devices under test applying such systems with special respect to their far-field characteristics in order to verify their proper functioning.

U.S. Pat. No. 8,093,909 B2 shows a method and device for measuring phase noise.

US 2008/0018450 A1 is directed to an interrogator and a method of discerning the presence of an object, and an interrogation system employing the same. Due to the fact that said interrogator employs not only near-field antennas but also far-field antennas, it can be seen that far-field measurements are done in the far-field, i.e., quite far away from the object to be investigated. As a consequence of this, such a far-field measurement requires much space, which leads to high costs and is therefore inefficient.

Accordingly, there is a need to provide a measurement system and a measurement method for investigating a device under test with special respect to its far-field characteristics in an efficient and cost-saving manner.

SUMMARY OF THE INVENTION

According to a first aspect of the invention, a measurement system is provided. The measurement system comprises a device under test comprising at least two signal paths, at least two measurement antennas being spatially separated in the near-field of the device under test, and a signal analysis unit. Whereas each of the at least two signal paths of the device under test comprises an antenna and a power amplifier, noise of the power amplifiers of the at least two signal paths of the device under test is not phase-coherent. In this context, the signal analysis unit is configured to perform at least two time-coherent measurements with the aid of the at least two measurement antennas with respect to the device under test in near-field. In addition to this, the signal analysis unit is further configured to calculate at least one signal characteristic, especially error vector magnitude and/or signal-to-noise ratio, in far-field on the basis of the at least two time-coherent measurements in the near-field. Advantageously, the device under test can be investigated with special respect to its far-field characteristics in an efficient and cost-saving manner without the requirement of large space.

According to a first preferred implementation form of the first aspect, the signal analysis unit is further configured to determine at least two result signals with known phase-offsets on the basis of the at least two time-coherent measurements, wherein the signal analysis unit is further configured to perform a phase-retrieval on the basis of said known phase-offset in order to determine the error vector magnitude and/or the signal-to-noise ratio in the far-field. Advantageously, interference and/or a random phase and/or noise can be removed from the measured signals.

According to a further preferred implementation form of the first aspect, the signal analysis unit is further configured to take into account a known beamforming gain of the device under test for the calculation of the error vector magnitude and/or the signal-to-noise ratio. Advantageously, the known beamforming gain, especially the known beamforming peak gain, can be applied to a signal portion and noise can then be mixed back into the signal in order to determine the signal-to-noise ratio in far-field.

According to a further preferred implementation form of the first aspect, the signal analysis unit is further configured to take into account position data of the at least two measurement antennas for performing the phase-retrieval. Advantageously, a random phase can be extracted out of the wave emitted by the device under test and/or of noise.

According to a further preferred implementation form of the first aspect, the signal analysis unit is further configured to determine a minimum far-field distance with respect to the device under test by $$\frac{2D^2}{\lambda}.$$

In this context, D is the largest dimension of the device under test, whereas $\lambda$ is the wavelength. Advantageously, efficiency of optional far-field measurements is increased due to the fact that the required measurement space can be reduced to a minimum.

According to a further preferred implementation form of the first aspect, the error vector magnitude is inversely proportional to the signal-to-noise ratio. Advantageously, due to said relationship, error vector magnitude in far field and signal-to-noise ratio in far-field can be calculated in a most efficient manner.

According to a further preferred implementation form of the first aspect, the signal analysis unit is further configured to calculate the signal-to-noise ratio in far-field by $$\frac{S + BF_{Gain}}{N + \Delta}.$$

In this context, S is signal power in the near-field, $BF_{Gain}$ is known beamforming gain of the device under test, N is noise of one of the power amplifiers, and $\Delta$ is additional noise caused by lacking phase-coherence of noise of the power amplifiers. Advantageously, said inventive equation allows for an accurate and efficient calculation of the signal-to-noise ratio in far-field.

According to a further preferred implementation form of the first aspect, $N+\Delta$ is a function of position of the at least two measurement antennas. Advantageously, due to the fact that the spatial position of the at least two measurement antennas can be determined quite easily, $N\pm\Delta$ is calculated in a very efficient manner.

According to a further preferred implementation form of the first aspect, with respect to the at least two signal paths of the device under test, phase differences regarding noise are not equal to phase differences regarding the respective signals. Advantageously, said relationship has been recognized within the scope of the invention in order to ensure accuracy and efficiency.

According to a second aspect of the invention, a measurement method is provided. The measurement method comprises the steps of performing at least two time-coherent measurements with the aid of at least two measurement antennas with respect to a device under test comprising at least two signal paths in the near-field, and calculating at least one signal characteristic, especially error vector magnitude and/or signal-to-noise ratio in far-field on the basis of the at least two time-coherent measurements in the near-field. In this context, the at least two measurement antennas are spatially separated in the near-field of the device under test, whereas each of the at least two signal paths of the device under test comprises an antenna and a power amplifier. In addition to this, noise of the power amplifiers of the at least two signal paths of the device under test is not phase-coherent. Advantageously, the device under test can be investigated with special respect to its far-field characteristics in an efficient and cost-saving manner without the requirement of large space.

According to a first preferred implementation form of the second aspect, the method further comprises the steps of determining at least two result signals with known phase-offsets on the basis of the at least two time-coherent measurements, and performing a phase-retrieval on the basis of said known phase-offset in order to determine the error vector magnitude and/or the signal-to-noise ratio in far-field. Advantageously, interference and/or a random phase and/or noise can be removed from the measured signals.

According to a further preferred implementation form of the second aspect, the method further comprises the step of taking into account a known beamforming gain of the device under test for the calculation of the error vector magnitude and/or the signal-to-noise ratio. Advantageously, the known beamforming gain, especially the known beamforming peak gain, can be applied to a signal portion and noise can then be mixed back into the signal in order to determine the signal-to-noise ratio in far-field.

According to a further preferred implementation form of the second aspect, the method further comprises the step of taking into account position data of the at least two measurement antennas for performing the phase-retrieval. Advantageously, a random phase can be extracted out of the wave emitted by the device under test and/or of noise.

According to a further preferred implementation form of the second aspect, the method further comprises the step of determining a minimum far-field distance with respect to the device under test by $$\frac{2D^2}{\lambda}.$$

In this context, D is the largest dimension of the device under test, whereas $\lambda$ is the wavelength. Advantageously, efficiency of optional far-field measurements is increased due to the fact that the required measurement space can be reduced to a minimum.

According to a further preferred implementation form of the second aspect, the error vector magnitude is inversely proportional to the signal-to-noise ratio. Advantageously, due to said relationship, error vector magnitude in far field and signal-to-noise ratio in far-field can be calculated in a most efficient manner.

According to a further preferred implementation form of the second aspect, the method further comprises the step of calculating the signal-to-noise ratio in far-field by $$\frac{S + BF_{Gain}}{N + \Delta}.$$

In this context, S is signal power in the near-field, $BF_{Gain}$ is known beamforming gain of the device under test, N is noise of one of the power amplifiers, and $\Delta$ is additional noise caused by lacking phase-coherence of noise of the power amplifiers. Advantageously, said inventive equation allows for an accurate and efficient calculation of the signal-to-noise ratio in far-field.

According to a further preferred implementation form of the second aspect, $N+\Delta$ is a function of position of the at least two measurement antennas. Advantageously, due to the fact that the spatial position of the at least two measurement antennas can be determined quite easily, $N+\Delta$ is calculated in a very efficient manner.

According to a further preferred implementation form of the second aspect, with respect to the at least two signal paths of the device under test, phase differences regarding noise are not equal to phase differences regarding the respective signals. Advantageously, said relationship has been recognized within the scope of the invention in order to ensure accuracy and efficiency.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
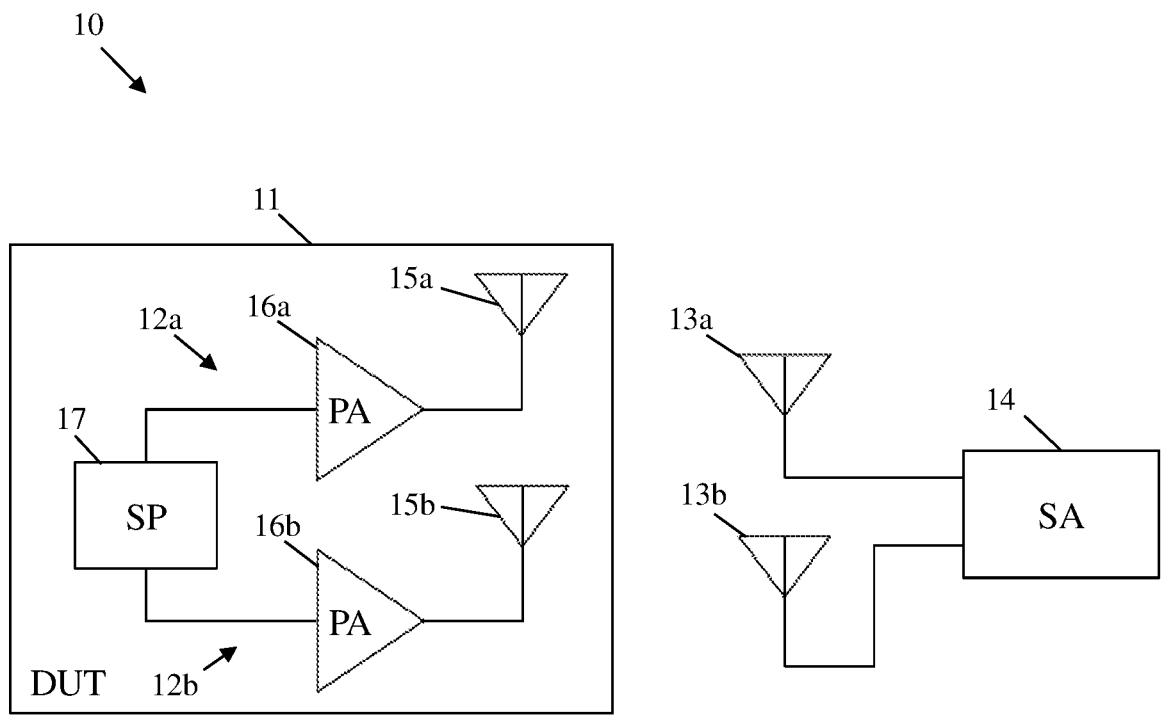
FIG. 1 shows an exemplary embodiment of the first aspect of the invention.

Firstly, FIG. 1 illustrates an exemplary embodiment of the inventive measurement system 10. The measurement system 10 comprises a device under test 11, two measurement antennas—a first measurement antenna 13a and a second measurement antenna 13b—and a signal analysis unit 14 connected to said measurement antennas 13a, 13b. In this context, said measurement antennas 13a, 13b are spatially separated in the near-field of the device under test 11.

Furthermore, the device under test 11 comprises a first signal path 12a and a second signal path 12b, each of which is connected to a signal processing unit 17. In this context, said signal processing unit 17 may comprise at least one mixer. Additionally or alternatively, said signal processing unit 17 may comprise at least one transceiver.

With respect to the two signal paths 12a, 12b of the device under test 11, it can be seen that the first signal path 12a comprises a first power amplifier 16a and a first antenna 15a, whereas the second signal path 12b comprises a second power amplifier 16b and a second antenna 15b. In this context, noise of the power amplifiers 16a, 16b of the signal paths 12a, 12b of the device under test 11 is not phase-coherent.

Figure 2:
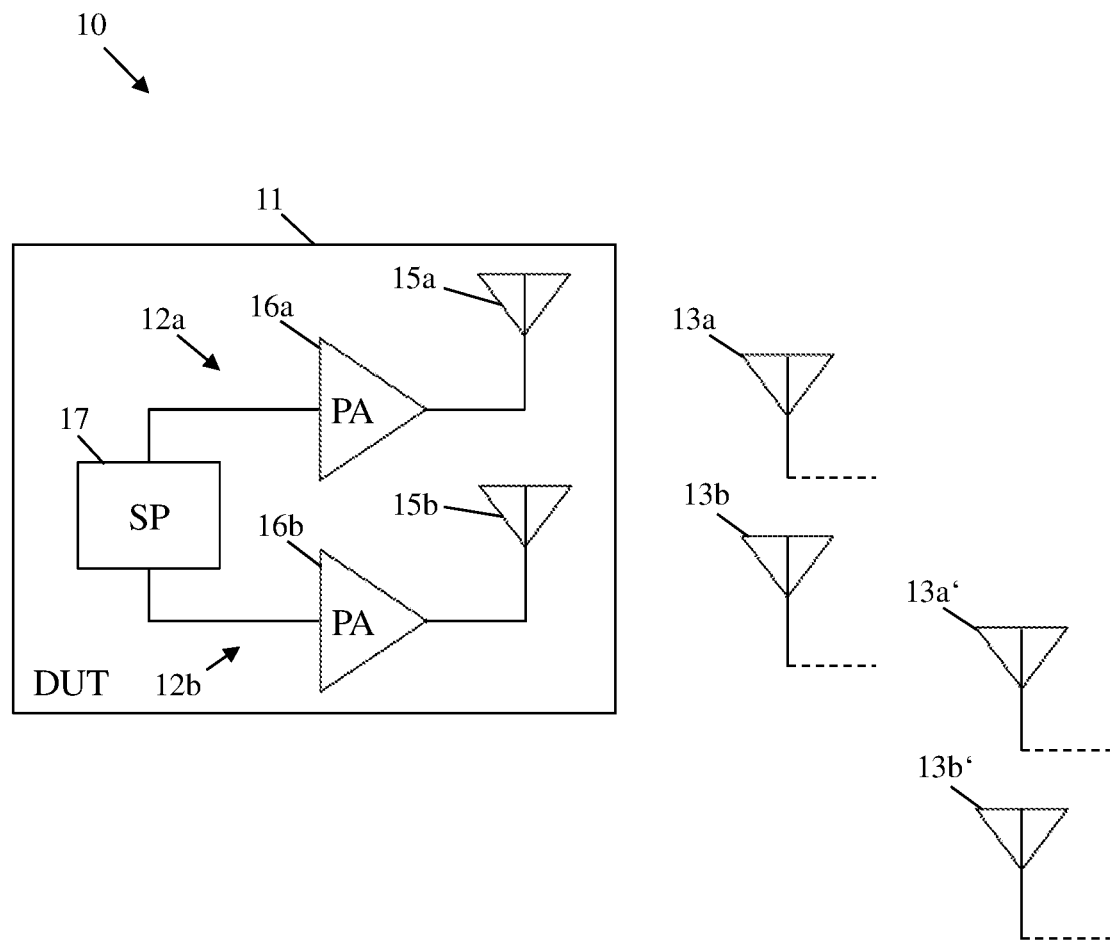
FIG. 2 shows the exemplary embodiment according to FIG. 1, wherein two time-coherent measurements are illustrated.

Moreover, the signal analysis unit 14 of the measurement system 10 is configured to perform at least two time-coherent measurements with the aid of the measurement antennas 13a, 13b with respect to the device under test 11, which is especially illustrated by FIG. 2. In addition to this, said signal analysis unit 14 is further configured to calculate error vector magnitude in far-field on the basis of said at least two time-coherent measurements in the near-field. Additionally or alternatively, the signal analysis unit 14 is configured to calculate signal-to-noise ratio in far-field on the basis of the at least two time-coherent measurements in the near-field. For the calculation of the error vector magnitude in the far-field, additionally or alternatively for the calculation of the signal-to-noise ratio in the far-field, the signal analysis unit 14 may be configured to take into account a known beamforming gain of the device under test 11.

In addition to this or as an alternative, the signal analysis unit 14 may be configured to determine at least two result signals with known phase-offsets on the basis of the at least two time-coherent measurements. In this context, the signal analysis unit 14 may further be configured to perform a phase-retrieval on the basis of said known phase-offset in order to determine the error vector magnitude in the far-field, additionally or alternatively to determine the signal-to-noise ratio in the far-field. For performing said phase-retrieval, the signal analysis unit 14 may additionally or alternatively be configured to take into account position data of the measurement antennas 13a, 13b.

Furthermore, the signal analysis unit 14 may additionally or alternatively be configured to determine a minimum far-field distance with respect to the device under test 11 by $$\frac{2D^2}{\lambda}.$$

In this context, D is the largest dimension of the device under test 11, whereas λ is the wavelength.

Moreover, with respect to the error vector magnitude and the signal-to-noise ratio in far-field determined with the aid of the measurement system 10, it is noted that the error vector magnitude in far-field is inversely proportional to the signal-to-noise ratio in far-field. In addition to this, with respect to the signal paths 12a, 12b of the device under test 11, it is noted that phase differences regarding noise are not equal to phase differences regarding the respective signals.

Additionally or alternatively, the signal analysis unit 14 may be configured to calculate the signal-to-noise ratio in far-field by $$\frac{S + BF_{Gain}}{N + \Delta}.$$

In this context, S is signal power in the near-field, $BF_{Gain}$ is known beamforming gain of the device under test 11, N is noise of one of the power amplifiers 16a, 16b, and Δ is additional noise caused by lacking phase-coherence of noise of the power amplifiers 16a, 16b. In this context, it is noted that N+Δ is a function of position of the measurement antennas 13a, 13b.

In the second place, as already mentioned above, FIG. 2 illustrates that the signal analysis unit 14 of the measurement system 10 is especially configured to perform at least two time-coherent measurements with the aid of the measurement antennas 13a, 13b with respect to the device under test 11. Preferably, said time-coherent measurements are performed at at least two spatial locations. Exemplarily, said time-coherent measurements are performed at two spatial locations, which is illustrated by the measurement antennas 13a, 13b being positioned at a first spatial location, and the same measurement antennas especially provided with different reference signs 13a', 13b' in order to show that the measurement antennas 13a, 13b have been moved to a second spatial location. In this context, with respect to the device under test 11, the signal analysis unit 14 may advantageously be configured to extract out a random phase of the wave emitted by the device under test 11 and/or noise.

Figure 3:
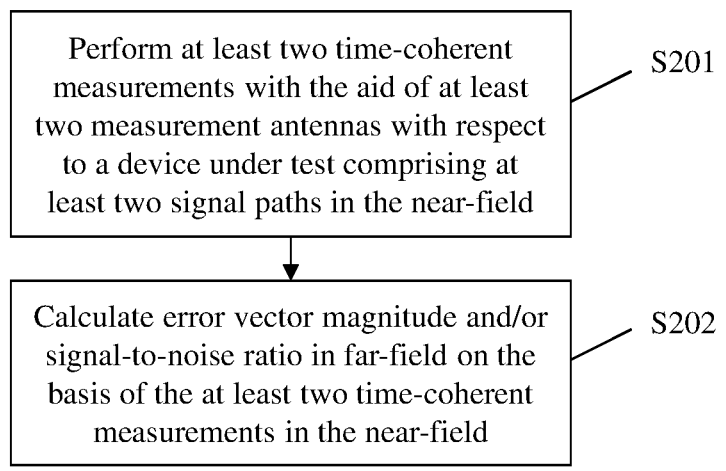
FIG. 3 shows a flow chart of an exemplary embodiment of the second aspect of the invention.

Finally, FIG. 3 shows a flow chart of the inventive method. In a first step S201, at least two time-coherent measurements are performed with the aid of at least two measurement antennas with respect to a device under test comprising at least two signal paths in the near-field. Then, in a second step S202, error vector magnitude and/or signal-to-noise ratio in far-field are calculated on the basis of the at least two time-coherent measurements in the near-field. In this context, it is noted that especially the at least two measurement antennas are spatially separated in the near-field of the device under test, whereas each of the at least two signal paths of the device under test comprises an antenna and a power amplifier. In addition to this, noise of the power amplifiers of the at least two signal paths of the device under test is especially not phase-coherent.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system comprising:
   a device under test comprising at least two signal paths,
   at least two measurement antennas being spatially separated in a near-field of the device under test, and
   a signal analysis unit,
   wherein each of the at least two signal paths of the device under test comprises an antenna and a power amplifier,
   wherein noise of the power amplifiers of the at least two signal paths of the device under test is not phase-coherent,
   wherein the signal analysis unit is configured to perform at least two time-coherent measurements with the aid of the at least two measurement antennas with respect to the device under test in the near-field,
   wherein the signal analysis unit is further configured to calculate at least one signal characteristic, especially error vector magnitude and/or signal-to-noise ratio, in a far-field on the basis of the at least two time-coherent measurements in the near-field,
   wherein the signal analysis unit is further configured to calculate the signal-to-noise ratio in the far-field by $$\frac{S + BF_{Gain}}{N + \Delta}$$

wherein S is signal power in the near-field,
wherein $BF_{Gain}$ is known beamforming gain of the device under test,
wherein N is noise of one of the power amplifiers, and
wherein $\Delta$ is additional noise caused by lacking phase-coherence of noise of the power amplifiers.

2. The measurement system according to claim 1, wherein the signal analysis unit is further configured to determine at least two result signals with known phase-offsets on the basis of the at least two time-coherent measurements, wherein the signal analysis unit is further configured to perform a phase-retrieval on the basis of said known phase-offset in order to determine the at least one signal characteristic, especially the error vector magnitude and/or the signal-to-noise ratio, in the far-field.

3. The measurement system according to claim 1, wherein the signal analysis unit is further configured to take into account a known beamforming gain of the device under test for the calculation of the at least one signal characteristic, especially the error vector magnitude and/or the signal-to-noise ratio.

4. The measurement system according to claim 2, wherein the signal analysis unit is further configured to take into account position data of the at least two measurement antennas for performing the phase-retrieval.

5. The measurement system according to claim 1, wherein the signal analysis unit is further configured to determine a minimum far-field distance with respect to the device under test by $$\frac{2D^2}{\lambda},$$

wherein D the largest dimension of the device under test, and
wherein $\lambda$ is the wavelength.

6. The measurement system according to claim 1, wherein the error vector magnitude is inversely proportional to the signal-to-noise ratio.

7. The measurement system according to claim 1, wherein $N+\Delta$ is a function of position of the at least two measurement antennas.

8. The measurement system according to claim 1, wherein with respect to the at least two signal paths of the device under test, phase differences regarding noise are not equal to phase differences regarding the respective signals.

9. A measurement method comprising the steps of:
performing at least two time-coherent measurements with the aid of at least two measurement antennas with respect to a device under test comprising at least two signal paths in a near-field,
calculating at least one signal characteristic, especially error vector magnitude and/or signal-to-noise ratio, in a far-field on the basis of the at least two time-coherent measurements in the near-field, and
calculating the signal-to-noise ratio in the far-field by $$\frac{S + BF_{Gain}}{N + \Delta}$$

wherein S is signal power in the near-field,
wherein $BF_{Gain}$ is known beamforming gain of the device under test,
wherein N is noise of one of the power amplifiers,
wherein $\Delta$ is additional noise caused by lacking phase-coherence of noise of the power amplifiers,
wherein the at least two measurement antennas are spatially separated in the near-field of the device under test,
wherein each of the at least two signal paths of the device under test comprises an antenna and a power amplifier, and
wherein noise of the power amplifiers of the at least two signal paths of the device under test is not phase-coherent.

10. The measurement method according to claim 9, wherein the method further comprises the steps of:
determining at least two result signals with known phase-offsets on the basis of the at least two time-coherent measurements, and
performing a phase-retrieval on the basis of said known phase-offset in order to determine the at least one signal characteristic, especially the error vector magnitude and/or the signal-to-noise ratio, in the far-field.

11. The measurement method according to claim 9, wherein the method further comprises the step of taking into account a known beamforming gain of the device under test for the calculation of the at least one signal characteristic, especially the error vector magnitude and/or the signal-to-noise ratio.

12. The measurement method according to claim 10, wherein the method further comprises the step of taking into account position data of the at least two measurement antennas for performing the phase-retrieval.

13. The measurement method according to claim 9, wherein the method further comprises the step of determining a minimum far-field distance with respect to the device under test by $$\frac{2D^2}{\lambda},$$

wherein D the largest dimension of the device under test, and
wherein $\lambda$ the wavelength.

14. The measurement method according to claim 9, wherein the error vector magnitude is inversely proportional to the signal-to-noise ratio.

15. The measurement method according to claim 9, wherein $N+\Delta$ is a function of position of the at least two measurement antennas.

16. The measurement method according to claim 9, wherein with respect to the at least two signal paths of the device under test, phase differences regarding noise are not equal to phase differences regarding the respective signals.

* * * * *